United States Patent [19]

Pao

[11] Patent Number: 5,386,343
[45] Date of Patent: Jan. 31, 1995

[54] DOUBLE SURFACE MOUNT TECHNOLOGY FOR ELECTRONIC PACKAGING

[75] Inventor: Yi-Hsin Pao, Livonia, Mich.

[73] Assignee: Ford Motor Company, Dearborn, Mich.

[21] Appl. No.: 150,319

[22] Filed: Nov. 12, 1993

[51] Int. Cl.⁶ .............................................. H05K 1/18
[52] U.S. Cl. ..................... 361/761; 361/790; 174/260; 257/686; 257/724
[58] Field of Search ............... 361/760, 761, 763, 764, 361/767, 772, 773, 774, 777, 790; 174/260, 250, 255; 257/684, 685, 686, 723, 724

[56] References Cited

U.S. PATENT DOCUMENTS

| | | |
|---|---|---|
| 4,631,820 | 12/1986 | Harada et al. |
| 4,742,431 | 5/1988 | Igarashi |
| 4,883,428 | 11/1989 | Tonooka |
| 4,959,750 | 9/1990 | Cnyrim et al. |
| 4,999,740 | 3/1991 | Ilardi et al. |
| 5,083,236 | 1/1992 | Chason et al. |

FOREIGN PATENT DOCUMENTS

| | | | |
|---|---|---|---|
| 3739985 | 6/1988 | Germany | |
| 2039587 | 2/1990 | Japan | |
| 430439A | 2/1992 | Japan | |
| 4071288 | 3/1992 | Japan | 174/260 |

OTHER PUBLICATIONS

IBM Technical Disclosure Bulletin, vol. 24, No. 4, Sep. 1981, "Structures for Connecting Electrical Circuits on Bubble Chips to I/O Pins on Bubble Chip Carriers".

Primary Examiner—Bot Ledynh
Attorney, Agent, or Firm—Mark L. Mollon; Roger L. May

[57] ABSTRACT

A novel printed circuit board is disclosed. The printed circuit board has a high density of circuit components with lower circuit components residing within recesses in a printed wiring board and upper circuit components residing above the lower circuit components.

16 Claims, 1 Drawing Sheet

DOUBLE SURFACE MOUNT TECHNOLOGY FOR ELECTRONIC PACKAGING

BACKGROUND OF THE INVENTION

1. Field of the Invention

Embodiments of the present invention relate generally to a printed circuit board and a method of manufacturing a printed circuit board. In one aspect, the present invention relates to a printed circuit board having a high density of circuit components, some of which are suitable for use as surface mounted components. In another aspect, the present invention relates to a method of manufacturing a printed circuit board having a high density of circuit components.

2. Description of Related Art

Conventional methods of mounting circuit components on a printed wiring board include a "through-hole" technique which involves extending leads, commonly called "posts", of a circuit component through the printed wiring board and then soldering in place. The posts electrically connect circuit paths embedded on or within the board.

Another mounting method, called "Surface Mount Technology" (SMT), involves initially placing circuit components onto circuit paths embedded on the upper surface of the printed wiring board and then soldering the component in place by a process called "reflow soldering". Common surface mount components utilize connector leads commonly referred to as "J-leads" or "gull-wings" which rest on the surface of the printed wiring board rather than penetrate through it as with the through-hole technique.

SMT increases the density of circuit components on a printed wiring board by enabling the use of smaller components which are arranged in a flat configuration on the surface of the board. In such surface mounted components, the leads to be surface mounted may be tightly spaced, as compared to components mounted by the through-hole technique, enabling more I/Os per unit area of the component. SMT requires less printed wiring board space due to increased packaging density, thus lowering the cost of the entire system. SMT is also less costly due to the elimination of the drilling procedure associated with conventional through-hole mounting methods. Also, many surface mounted components may be soldered in place at the same time using reflow soldering.

In the past, efforts to increase the density of printed circuit boards have included the mounting of circuit components within depressions or wells etched into the printed circuit board. See, for example, Ilardi et al. U.S. Pat. No. 4,999,740. Efforts to orient circuit components on a printed circuit board include the mounting of circuit components within or above openings etched through the printed circuit board. See, for example, IBM Technical Disclosure Bulletin, September, 1981; Kobayashi Japanese Patent 30,439; Harada et al. U.S. Pat. No. 4,631,820; Inoue German Patent No. 3,739,985; Cnyrim et al. U.S. Pat. No. 4,959,750. Still other efforts to orient circuit components on a printed circuit board include the mounting of two circuit boards together, see for example Igarashi U.S. Pat. No. 4,742,431, the mounting of circuit components within a socket which is then mounted to the printed circuit board, see for example, Tonooka U.S. Pat. No. 4,883,428, or the housing of circuit components within an inductor structure, see for example Chason et al. U.S. Pat. No. 5,083,236.

High density printed circuit boards create greater utility in a smaller electronic device. Increasing the density of circuit components on a printed circuit board, however, often results in overheating of the components leading to eventual burnout and replacement of the components. The resulting overheating can also cause higher stress and strain in the interconnects, such as solder joints, leading to an early failure. The need to increase density while reducing repairwork is necessary to make further advances in the efficiency and reliability of smaller electronic devices.

Unfortunately, prior efforts (1) fail to maximize the density of circuit components on a printed circuit board and (2) fail to increase density in a manner which reduces repairwork associated with the devices incorporating the printed circuit boards. A need therefore exists to develop a printed circuit board which maximizes density of circuit components while reducing repairwork, thus leading to smaller, more efficient and reliable electronic devices.

SUMMARY OF THE INVENTION

The present invention includes a novel printed circuit board having a high density of circuit components. The printed circuit board of the present invention includes a printed wiring board having at least one recess. At least one lower circuit component occupies the recess and at least one upper circuit component is positioned above the lower circuit component. Both the lower and upper circuit components are independent of each other and are electrically connected to an upper surface of the printed wiring board.

It is accordingly an object of the present invention to provide a printed circuit board having a high density of circuit components. It is a further object of the present invention to increase the efficiency of electronic devices utilizing the printed circuit board of the present invention. Other objects, features or advantages of the present invention will become apparent from the following description taken in conjunction with the accompanying drawings.

BRIEF DESCRIPTION OF THE DRAWINGS

In the course of the detailed description of certain preferred embodiments to follow, reference will be made to the attached drawings, in which.

DESCRIPTION OF CERTAIN PREFERRED EMBODIMENTS

The principles of the present invention may be applied with particular advantage to obtain a printed circuit board having a high density of circuit components, preferred embodiments of which may be generally seen at FIGS. 1, 2 and 3, and which are described more fully below.

Figure 1:
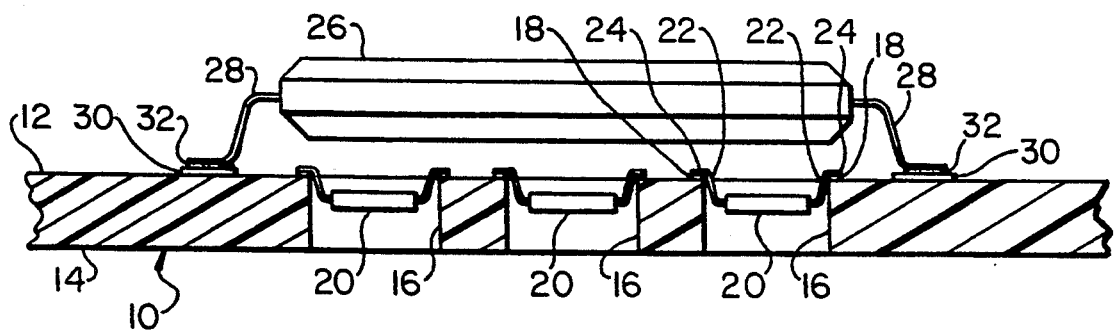
FIG. 1 is a side view of an embodiment of the present invention showing a portion of a printed wiring board in cross section with lower circuit components occupying corresponding recesses and an upper circuit component positioned above the lower circuit components.

FIG. 1 shows a portion of printed wiring board 10, in cross section, having upper surface 12 and lower surface 14. Upper surface 12 has a wiring pattern (not shown) for a circuit which performs a desired function. Printed wiring boards of the type shown at 10 are commonly used in many electronic devices to perform electronic functions in items such as calculators, personal and mainframe computers, automotive and avionic devices and the like, as well as, other devices where electronic circuitry is desired.

Printed wiring board 10 has one or more recesses 16, each having interior surfaces, which are depicted in FIG. 1 as openings through printed wiring board 10. Although recess 16 is shown as an opening, recess 16 may also be a groove or well manufactured into the printed wiring board. Whether recess 16 is an opening, well or groove, it may be in any configuration or shape consistent with the teachings of the present invention and may be located wherever desired on printed wiring board 10.

Positioned on printed wiring board 10 at upper surface 12 adjacent to recess 16, are circuit paths 18 which electrically connect lower circuit component 20. Lower circuit components 20 useful in the present invention are compatible with interior surface of recess 16 and are generally rectangular or square in shape. Such lower circuit components useful in the present invention include circuits or other electronic components which are packaged for surface mounting including packages such as smaller outline packages (SOP), quad flat packs (QFP) and the like. It is to be understood that the lower circuit components are not restricted to any particular electronic function.

As shown in FIG. 1, lower circuit component 20 is suspended within recess 16 by lower component lead connectors 22 which are electrically connected to circuit paths 18. Lower circuit component 20 is suspended either in whole or in part within recess 16 without contacting interior surface of recess 16.

In a preferred embodiment, lower circuit component 20 is suspended entirely within recess 16 by lower component lead connectors 22 commonly referred to as "gull wing" lead connectors which are surface mounted to circuit paths 18 thereby fixedly electrically connecting lower circuit component 20 within recess 16. Gull wing lead connectors 22 are of a size and orientation determined by the lower circuit component utilized in the present invention. For example, certain lower circuit components useful in the present invention may have lead connectors on all four sides of the component or on two opposite sides of the component, depending upon the packaging design of the component itself. Circuit paths 18 correspond to lower component lead connectors 22 of lower circuit component 20. It is to be understood that the present invention is not limited to particular types of lead connectors, such as "gull wing" lead connectors, but that other lead connectors are contemplated by the present invention, such as, wire bonds, sigmoid clip leads, and the like. In a preferred embodiment, lower component lead connectors of the present invention are capable of being surface mounted to printed wiring board 10. In a more preferred embodiment, existing lower circuit components, such as, SOPs and QFPs which are presently designed to reside above upper surface 12, may be inverted and suspended within recess 16, as shown in FIG. 1. Surface mounting may be accomplished by a vapor or reflow soldering process which is well known to those skilled in the art. As can be seen in FIG. 1, lower surface component 20 is fixedly electrically connected to circuit paths 18 via gull wing lead connectors 22 and solder joints 24.

As shown in FIG. 1, a plurality of lower circuit components 20 occupy corresponding recesses 16 within printed wiring board 10. It is to be understood that the nature and amount of lower circuit components of the present invention is determined by the particular function to be performed by the printed circuit board. The location of the recesses and, thus, the lower circuit components which occupy the recesses, is to be determined by the design of the printed circuit board. It is to be further understood that the embodiments depicted in FIGS. 1, 2 and 3 are certain preferred embodiments of the present invention and are not intended in any way to limit the nature and scope of the present invention.

As shown in FIG. 1, upper circuit component 26 is positioned above the plurality of lower circuit components 20 and is supported by upper component lead connectors 28 on upper surface 12 of printed wiring board 10. Such upper surface components useful in the present invention include circuits or other electronic components which are packaged for surface mounting including packages such as Quad Flat Packs (QFP), plastic leaded chip carriers (PLCC) and the like. It is to be understood that the upper circuit components are not restricted to any particular electronic function.

Such upper circuit components useful in the present invention are generally rectangular or square in shape and allow lower circuit components to reside, either partially or entirely, under the upper circuit component.

Upper component lead connectors 28 are electrically connected to circuit paths 30 and are of the type commonly referred to as "J-lead" connectors or, as shown in FIG. 1, "gull wing" lead connectors which are surface mounted to circuit paths 30 thereby fixedly electrically connecting upper circuit component 26 to printed wiring board 10.

Gull wing lead connectors 28 are of a size and orientation determined by the upper circuit component utilized in the present invention. For example, certain upper circuit components useful in the present invention may have lead connectors on all four sides of the component or on two opposite sides of the component, depending upon the packaging design of the component itself. Circuit paths 30 correspond to upper component lead connectors 28 of upper circuit component 26. It is to be understood that the present invention is not limited to "J-lead" or "gull wing" lead connectors, but that other lead connectors are contemplated by the present invention, such as, butt leads, clip leads and the like. Surface mounting may be accomplished by a vapor or reflow soldering process which is well known to those skilled in the art. As can be seen in FIG. 1, upper surface component 26 is fixedly electrically connected to printed wiring lead connector 30 via gull wing lead connector 28 and solder joint 32.

According to the principles of the present invention, upper circuit component 26 is positioned above one or more lower circuit components 20, either in whole or in part, thereby providing a high density of circuit components. As can be seen in FIG. 1, upper circuit component 26 is nonidentical to, and independent of, lower circuit components 20 while each are preferably fixedly electrically surface mounted to upper surface 12 of printed wiring board 10.

Figure 2:
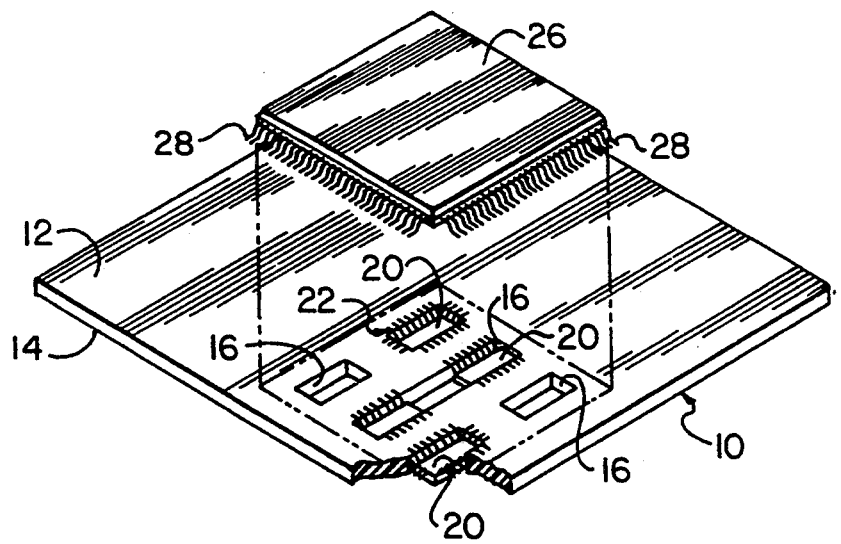
FIG. 2 is a partial exploded view of the embodiment of FIG. 1 with a portion of the printed wiring board partially broken away.

FIG. 2 depicts a partial exploded view of the embodiment of FIG. 1 in which lower circuit components 20 reside within corresponding recesses 16 and are surface mounted via gull wing lead connectors 22 to upper surface 12 of printed wiring board 10. As shown in FIG. 2, a single lower circuit component occupies a single recess or a multiple of lower circuit components occupy a single recess. Upper circuit component 26 resides above lower circuit components 20 and is surface mounted via gull wing lead connectors 28 to upper surface 12 of printed wiring board 10.

Figure 3:
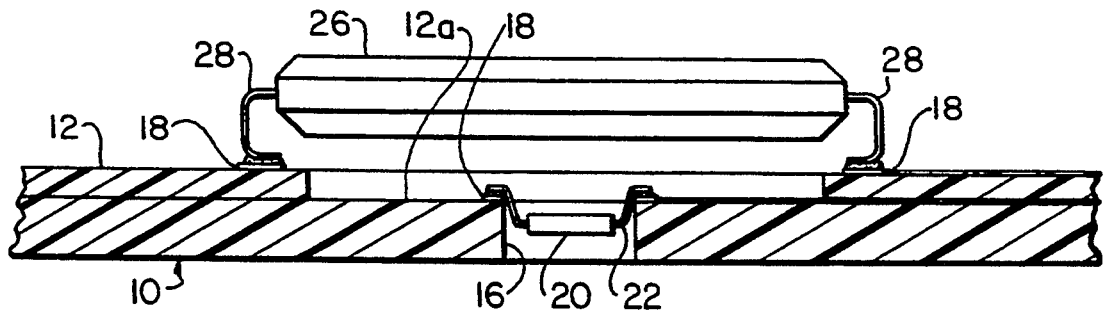
FIG. 3 is a side view of an alternate embodiment of the present invention showing a portion of a printed wiring board in cross section having a stepped surface with a lower circuit component occupying a corresponding recess and an upper circuit component positioned above the lower circuit component.

An alternate embodiment of the present invention is depicted in FIG. 3 in which printed wiring board 10 has upper surface 12 which includes a stepped upper surface 12a. As indicated in FIG. 3, lower circuit component 20 resides within corresponding recess 16 and is surface mounted via gull wing lead connectors 22 to stepped upper surface 12a of printed wiring board 10. Upper circuit component 26 resides above lower circuit component 20 and is surface mounted via J-lead connectors 28 to upper surface 12 of printed wiring board 10. Circuit paths 18 are on the surface of or may be embedded within printed wiring board 10 and correspond to gull wing lead connectors 22 or J-lead connectors 28.

Although not depicted in FIGS. 1, 2, or 3, other embodiments of the present invention provide for a plurality of upper circuit components which are positioned above one or more lower circuit components, either in whole or in part. The nature, amount and positioning of upper and lower circuit components on a printed circuit board according to the teachings of the present invention is to be determined by the function which the printed circuit board will perform when utilized by a particular electronic device.

Preferred embodiments of the present invention advantageously improve the efficiency of electronic packaging by utilizing surface mount technology which allows the upper and lower circuit components to be fixedly electrically mounted at the same time to the upper surface of the printed wiring board. Since the components are mounted to the upper surface of the printed wiring board, the components are easy to place and only one reflow or soldering process is required, thus lowering the overall cost of production and increasing the packaging density. Additionally, since all circuit connections are on an upper surface of the board, they may be easily inspected and repaired.

Preferred embodiments of the present invention advantageously increase the density of circuit components on a printed circuit board by allowing more circuit components to occupy the same area on the board. Since lower circuit components reside in recesses and upper circuit components are positioned above the lower circuit components, the density of components on the board is increased without increasing the thickness of the board. Additionally, existing circuit components which are designed to reside above the upper surface of the board may be readily utilized by the present invention by being inverted and suspended within the recesses thereby eliminating the need for specially manufactured circuit components.

Embodiments of the present invention advantageously improve the ability of the electronic device to remove heat generated by circuit components on the printed circuit board, thereby lowering the operating temperature of the device. The lower circuit components occupy corresponding recesses without contacting the interior of the recesses. The upper circuit component resides above, and is independent of, the lower circuit components. Embodiments of the present invention, therefore, allow air to flow around each circuit component thereby facilitating the removal of heat generated by the circuit component. In a certain preferred embodiment, lower circuit components reside in openings through the printed wiring board allowing greater air flow around and between upper and lower circuit components further increasing the ability of the electronic device to remove heat generated by the circuit components. The advantageous heat removing capabilities of the present invention decrease the likelihood of circuit component burnout and increase solder joint reliability thereby reducing the repair work associated with component replacement.

It is to be understood that the embodiments of the invention which have been described are merely illustrative of some applications of the principles of the invention. Numerous modifications may be made by those skilled in the art without departing from the true spirit and scope of the invention.

What is claimed is:

1. A printed circuit board comprising, in combination,
   a printed wiring board having a plurality of recesses;
   a plurality of circuit components comprising upper and lower circuit components electrically connected to the printed wiring board with at least one lower circuit component occupying a corresponding recess and at least one upper circuit component positioned above a plurality of lower circuit components;
   the upper and lower circuit components being independent of each other and each being fixedly electrically connected to an upper surface of the printed wiring board.

2. The printed circuit board of claim 1 wherein lower circuit components are nonidentical with the upper circuit components.

3. The printed circuit board of claim 2 wherein
   at least one of the upper and lower circuit components is surface mounted to the upper surface of the printed wiring board.

4. The printed circuit board of claim 3 wherein
   the upper and lower circuit components are surface mounted to the upper surface of the printed wiring board.

5. The printed circuit board of claim 4 wherein
   the at least one lower circuit component is suspended within the corresponding recess by leads.

6. The printed circuit board of claim 5 wherein
   the at least one lower circuit component resides in the corresponding recess without contacting an interior surface of the corresponding recess.

7. The printed circuit board of claim 6 wherein
   a plurality of upper circuit components are positioned above the plurality of lower circuit components.

8. The printed circuit board of claim 7 wherein the corresponding recess is an opening.

9. The printed circuit board of claim 7 wherein the corresponding recess is a well.

10. A printed circuit board comprising, in combination,
    a printed wiring board having a first upper surface and a second descending stepped upper surface with the second descending stepped upper surface having a plurality of recesses therein;

a plurality of circuit components comprising upper and lower circuit components, at least one upper circuit component being fixedly electrically surface mounted to the first upper surface of the printed wiring board and at least one lower circuit component being fixedly electrically surface mounted to the second descending stepped upper surface, the at least one lower circuit component being suspended within a corresponding recess; and the at least one lower circuit component being non-identical with and independent of the at least one upper circuit component with the at least one upper circuit component being positioned above the at least ode lower circuit component.

11. The printed circuit board of claim 10 wherein the at least one lower circuit component is suspended within the corresponding recess without contacting an interior surface of the corresponding recess.

12. The printed circuit board of claim 11 wherein the at least one upper circuit component is positioned above a plurality of lower circuit components.

13. The printed circuit board of claim 12 wherein a plurality of upper circuit components are positioned above the plurality of lower circuit components.

14. The printed circuit board of claim 13 wherein the corresponding recess is an opening.

15. The printed circuit board of claim 13 wherein the corresponding recess is a well.

16. A printed circuit board comprising, in combination, a printed wiring board having a first upper surface and a second descending stepped upper surface with the second descending stepped upper surface having a plurality of openings therein;

a plurality of circuit components comprising upper and lower circuit components, a plurality of upper circuit components being fixedly electrically surface mounted to the first upper surface of the printed wiring board and a plurality of lower circuit components being fixedly electrically surface mounted to the second descending stepped upper surface, the plurality of lower circuit component being suspended within corresponding recesses without contacting an interior surface of the corresponding recess with the plurality of upper circuit components positioned above the plurality of lower circuit components; and the plurality of lower circuit components being non-identical with and independent of the plurality of upper circuit components.

* * * * *